United States Patent
Kuo et al.

(10) Patent No.: US 7,838,135 B2
(45) Date of Patent: Nov. 23, 2010

(54) HEAT ASSISTED MAGNETIC RECORDING MEDIUM AND METHOD FOR FABRICATING THE SAME

(75) Inventors: Po-Cheng Kuo, No. 1, Sec. 4, Roosevelt Rd., Jhongjheng District, Taipei City (TW) 100; Yen-Hsiang Fang, Taipei (TW); An-Cheng Sun, Taipei (TW); Tao-Hsuan Yang, Taipei (TW); Chun-Yuan Chou, Taipei (TW); Ching-Ray Chang, Taipei (TW)

(73) Assignee: Po-Cheng Kuo, Taipei (TW)

( * ) Notice: Subject to any disclaimer, the term of this patent is extended or adjusted under 35 U.S.C. 154(b) by 804 days.

(21) Appl. No.: 11/462,400

(22) Filed: Aug. 4, 2006

(65) Prior Publication Data
US 2007/0212573 A1    Sep. 13, 2007

(30) Foreign Application Priority Data
Mar. 13, 2006    (TW) .............................. 95108481 A

(51) Int. Cl.
*G11B 5/66*    (2006.01)
(52) U.S. Cl. .................................................... 428/829
(58) Field of Classification Search ........................ None
See application file for complete search history.

(56) References Cited

U.S. PATENT DOCUMENTS

| | | | |
|---|---|---|---|
| 6,881,495 B2 * | 4/2005 | Kikitsu et al. | 428/827 |
| 2003/0064249 A1 | 4/2003 | Uwazumi et al. | |
| 2005/0041335 A1 | 2/2005 | Kikitsu et al. | |
| 2006/0188743 A1 | 8/2006 | Seki et al. | |
| 2006/0222904 A1 * | 10/2006 | Hsia et al. | 428/832 |
| 2007/0026263 A1 * | 2/2007 | Kubota et al. | 428/832 |

FOREIGN PATENT DOCUMENTS

| | | |
|---|---|---|
| JP | 2002203306 | 7/2002 |
| WO | 2004086427 A1 | 10/2004 |

OTHER PUBLICATIONS

Fang et al., "Magnetic properties of CoTb/FePt(001) nano-bilayer films", Nanotechnology, vol. 17, 2006, pp. 2411-2414.*

* cited by examiner

*Primary Examiner*—Holly Rickman
(74) *Attorney, Agent, or Firm*—Volpe and Koenig, PC

(57) ABSTRACT

A novel heat assisted magnetic recording (HAMR) medium and the fabrication method therefor are provided. The exchange coupling effect occurring at the interface of FePt/CoTb double layers is adopted, and thus the resulting magnetic flux would be sufficient enough to be detected and readout under the room temperature. The provided HAMR medium exhibits a relatively high saturation magnetization and perpendicular coercivity, and thus possesses a great potential for the ultra-high density recording application.

13 Claims, 7 Drawing Sheets

HEAT ASSISTED MAGNETIC RECORDING MEDIUM AND METHOD FOR FABRICATING THE SAME

FIELD OF THE INVENTION

The present invention relates to a recording medium and the fabrication method therefor, and more particularly to a heat assisted magnetic recording (HAMR) medium and the fabrication method therefor.

BACKGROUND OF THE INVENTION

Currently, the heat assisted magnetic recording (HAMR) method with writing and magnetic flux reading is well proposed for increasing the perpendicular recording density of the magnetic disk, where the amorphous rare earth-transition metal (RE-TM) thin films are usually applied as the recording medium therefor.

The RE-TM thin film is advantageous in having the perpendicular magnetic anisotropy above $10^6$ erg/cm$^3$ and exhibiting the perpendicular magnetization, and thus it is always considered as a candidate for HAMR. Generally, the recording medium for HAMR needs to be provided with the following properties including a satisfactory magneto-optical writing performance, a large saturation magnetization, Ms, that generates a sufficient magnetic flux for the giant magnetoresistance (GMR) head or the tunneling magnetoresistance (TMR) head readout, and a large perpendicular coercivity, Hc⊥, so as to resist the self-demagnetization. Apparently, the traditional magneto-optical (MO) recording medium is not suitable for being applied for HAMR because such medium fails to generate sufficient magnetic flux for GMR or TMR head readout owing to the relatively lower saturation magnetization (Ms) value thereof.

For overcoming the drawbacks of the conventional recording medium with a relatively lower Ms value, the prevent invention provides an improved HAMR medium of a FePt/CoTb bi-layer structure, in which the Ms value and Hc⊥ value thereof are significantly enhanced owing to a relatively high Ms value of the FePt (001) thin film and a relatively high exchange energy at the interface between the FePt/CoTb bi-layer structure.

SUMMARY OF THE INVENTION

It is a first aspect of the present invention to provide a heat assisted magnetic recording (HAMR) medium with a relatively high saturation magnetization (Ms) and perpendicular coercivity (Hc⊥), so as to produce sufficient magnetic flux under the room temperature for signal readout.

It is a second aspect of the present invention to provide a method for fabricating a novel HAMR medium which exhibits a relatively high saturation magnetization (Ms) and perpendicular coercivity (Hc), so that the provided HAMR medium is suitable for being readout by the giant magneto-resistive (GMR) head or the tunneling magneto-resistive (TMR) head under the room temperature.

In accordance with the first aspect of the present invention, a magnetic recording medium is provided. The provided medium includes a substrate, an underlayer located on the substrate, a buffer layer located on the underlayer, a magnetic layer located on the buffer layer and a recording and reading layer located on the magnetic layer.

Preferably, the substrate is one of a glass substrate and an oxidized Si substrate.

Preferably, the underlayer is a Cr layer.

Preferably, the Cr layer has a thickness ranged from 10 to 100 nm.

Preferably, the thickness of the Cr layer is 70 nm.

Preferably, the buffer layer is a Pt layer.

Preferably, the Pt layer has a thickness ranged from 1 to 10 mm.

Preferably, the thickness of the Pt layer is 2 nm.

Preferably, the magnetic layer is a $Fe_xPt_{100-x}$ layer and the recording and reading layer is a $Co_yTb_{100-y}$ layer.

Preferably, x is ranged from 45 to 55 and y is ranged from 65.8 to 71.9.

Preferably, x is 50 and y is 70.44.

Preferably, the $Fe_xPt_{100-y}$ layer has a thickness ranged from 5 to 60 nm, and the $Co_yTb_{100-y}$ layer has a thickness ranged from 20 nm to 60 nm.

Preferably, the thickness of the $Fe_xPt_{100-x}$ layer is 20 nm, and the thickness of the $Co_yTb_{100-y}$ layer is 50 nm.

In accordance with the mentioned aspect, the provided heat assisted magnetic recording medium further includes a passiviation layer located on the recording and reading layer.

Preferably, the passiviation layer is a layer of silicon nitride.

In accordance with the second aspect of the present invention, a method for fabricating a magnetic recording medium is provided. The provided method includes steps of: (a) providing a substrate; (b) performing a thermal process to the substrate; (c) forming an underlayer of Cr on the substrate; (d) forming a buffer layer of Pt on the underlayer; (e) forming a layer of $Fe_xPt_{100-x}$ on the buffer layer; and (f) forming a layer of $Co_yTb_{100-y}$ on the layer of $Fe_xPt_{100-x}$.

Preferably, the step (b) further includes a step of heating the substrate to a first temperature.

Preferably, the first temperature is less than 800° C.

Preferably, the first temperature is 350° C.

Preferably, in the step (b), the thermal process is performed for 5 to 90 minutes.

Preferably, in the step (b), the first temperature is 350° C., and the thermal process is performed for 30 minutes.

Preferably, in the step (b), the thermal process is performed under a pressure ranged from $1\times10^{-9}$ to $1\times10^{-6}$ Torr.

Preferably, in the step (c), the buffer layer of Cr is formed on the substrate under a temperature of 350° C.

Preferably, in the step (d), the buffer layer of Pt is formed on the underlayer under a second temperature below 800° C.

Preferably, the second temperature is 350° C.

Preferably, in the step (e), the layer of $Fe_xPt_{100-x}$ is formed on the buffer layer under a third temperature below 800° C.

Preferably, the third temperature is 420° C.

Preferably, in the step (f), the layer of $Co_yTb_{100-y}$ is formed on the layer of $Fe_xPt_{100-x}$ under a fourth temperature below 50° C.

Preferably, the fourth temperature is an ambient temperature.

Preferably, the underlayer of Cr, the buffer layer of Pt, the layer of $Fe_xPt_{100-x}$ and the layer of $Co_yTb_{100-y}$ are formed by DC magnetron sputtering in an ultrahigh vacuum sputtering chamber.

Preferably, the underlayer of Cr, the buffer layer of Pt, the layer of $Fe_xPt_{100-x}$ and the layer of $Co_yTb_{100-y}$ are deposited under an argon pressure ranged from 2 to 12 mTorr.

Preferably, the argon pressure is 5 mTorr.

Preferably, the layer of $Fe_xPt_{100-x}$ is deposited by DC magnetron sputtering with a first DC power ranged from 0.2 to 0.5 W/cm$^2$.

Preferably, the first DC power is 0.22 W/cm$^2$.

Preferably, the layer of $Co_yTb_{100-y}$ is deposited by DC magnetron sputtering with a second DC power ranged from 1 to 4 $W/cm^2$.

Preferably, the second DC power is 2.96 $W/cm^2$.

In accordance with the mentioned aspect, the present method further includes a step of (g) forming a passiviation layer on the layer of $Co_yTb_{100-y}$.

Preferably, the passiviation layer is formed by magnetron sputtering with an RF power ranged from 2 to 7 $W/cm^2$.

Preferably, the RF power is 2.47 $W/cm^2$.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

In accordance with the preferred embodiment of the present invention, the improved heat assisted magnetic recording (HAMR) medium is achieved by a novel recording layer sequence of a first magnetic layer and a second magnetic layer.

The fabrication method for the heat assisted magnetic recording (HAMR) medium according to the present invention is illustrated with reference to FIG. 1.

Figure 1:
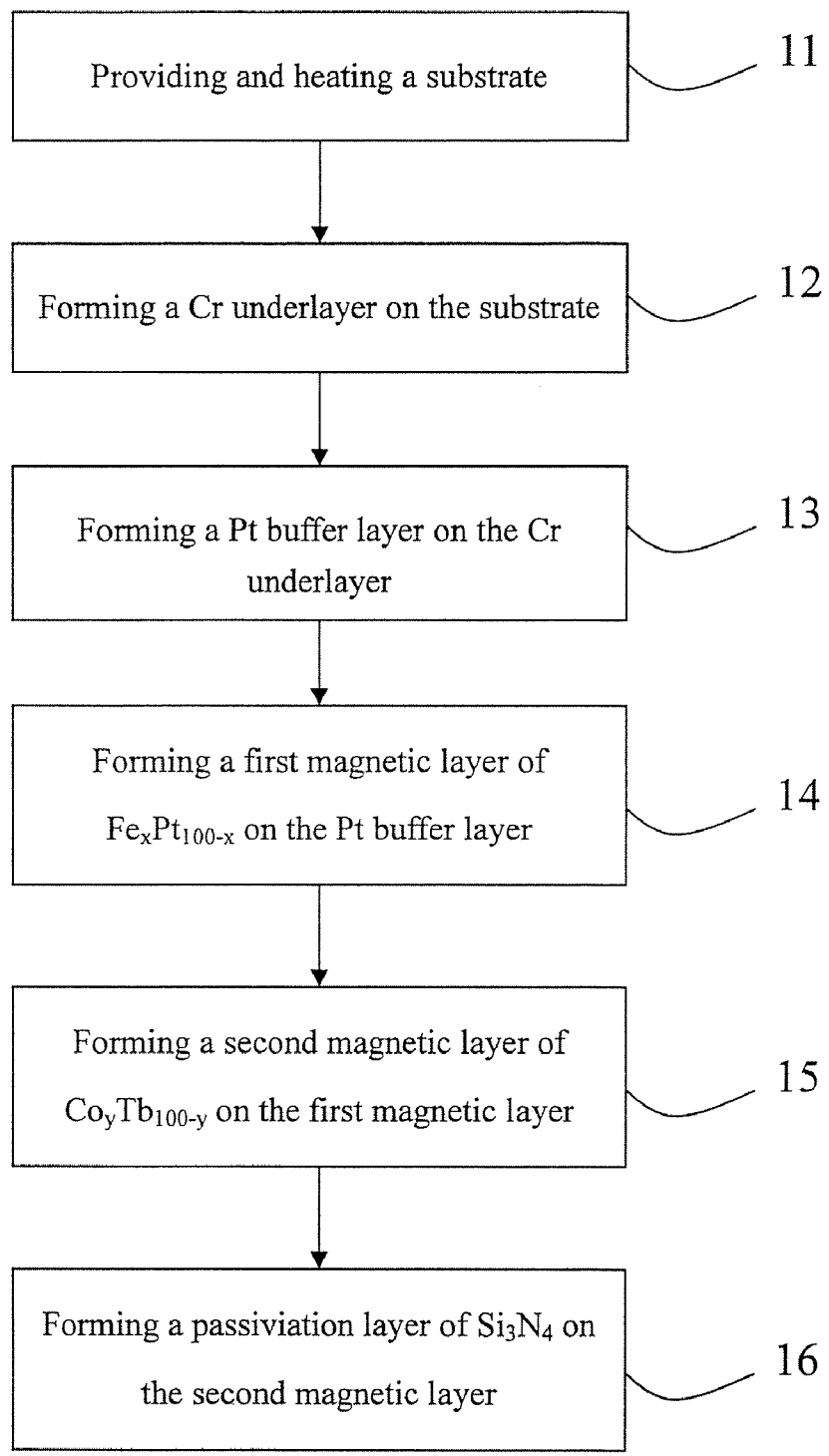
FIG. 1 is a flow chart illustrating the method for fabricating the heat assisted magnetic recording (HAMR) medium according to a preferred embodiment of the present invention.

Please refer to FIG. 1, which is a flow chart illustrating the method for fabricating the HAMR medium according to a preferred embodiment of the present invention. According to the preferred embodiment, a substrate is first provided and heated to about 350° C., as shown in the step 11. An underlayer of Cr is formed on the substrate, as shown in the step 12. Subsequently, a buffer layer of Pt is formed on the underlayer, as shown in the step 13. Afterward, a magnetic layer of $Fe_xPt_{100-x}$ is formed on the buffer layer and then a recording and reading layer of $Co_yTb_{100-y}$ is formed thereon, as shown in the steps 14 and 15, respectively. A passiviation layer of $Si_3N_4$ is formed on the resulting layer sequence, and then the HAMR medium according to the present invention is hence fabricated, as shown in the step 16.

In the present invention, the underlayer, the buffer layer, the first magnetic layer and the second magnetic layer are formed by DC magnetron sputtering in an ultrahigh vacuum sputtering chamber, where the targets of CoTb alloy and FePt alloy as well as the respective metallic targets of Co, Tb, Fe and Pt are adoptable therefor. The sputtering process is performed under an argon pressure ranged from 2 to 12 mTorr, and preferably, an argon pressure of 5 mTorr, wherein the first magnetic layer is deposited by DC magnetron sputtering with a first DC power ranged from 0.2 to 0.5 $W/cm^2$ (preferably 0.22 $W/cm^2$), and the second magnetic layer is deposited with a second DC power ranged from 1 to 4 $W/cm^2$ (preferably 2.96 $W/cm^2$).

The passivation layer of $Si_3N_4$ is formed by magnetron sputtering with an RF power ranged from 2 to 7 $W/cm^2$ (preferably 2.47 $W/cm^2$).

In accordance with the present invention, the substrate temperature is controlled below 800° C., and preferably at 350° C. while depositing the underlayer of Cr, the buffer layer of Pt and the first magnetic layer of $Fe_xPt_{100-x}$. Moreover, when the second magnetic layer of $Co_yTb_{100-y}$ is deposited, the substrate temperature is controlled below 50° C., and preferably at the ambient temperature. Furthermore, the annealing process is performed at an annealing temperature ranged from 300 to 800° C. with a time period ranged from 5 to 90 minutes. In a preferred embodiment, the annealing temperature is 350° C. and the time period is 30 minutes, and the layer sequence is annealed under a working pressure below $1 \times 10^{-6}$ Torr, and preferably, under a working pressure of $1 \times 10^{-9}$ Torr.

In a further preferred embodiment according to the present invention, the $Fe_{50}Pt_{50}(001)/Pt(001)/Cr(200)$ layer sequence is fabricated on the 7059 coming glass substrate by DC magnetron sputtering in an ultrahigh vacuum sputtering chamber. Alternatively, a cleaned quartz substrate or a naturally oxidized silicon substrate is also adoptable in the present invention. The base pressure is controlled better than $5 \times 10^{-9}$ torr before sputtering. The substrate is heated to 350° C. and the Cr(200) underlayer as well as the Pt(001) buffer layer are deposited thereon. The deposition temperature for the $Fe_{50}Pt_{50}$ (20 nm) magnetic layer is set to 420° C., so as to overcome the order-disorder transformation energy barrier to yield the $L1_0$ FePt phase therefor. The thickness of the Cr underlayer and the Pt buffer layer is 70 nm and 2 nm, respectively. In the present invention, the $Co_yTb_{100-y}$ layers with various thicknesses (20 nm~60 nm) are deposited on the $Fe_{50}Pt_{50}(001)/Pt(001)/Cr(200)$ layer sequence by DC magnetron sputtering at the ambient temperature, and finally, the passiviation layer of $Si_3N_4$ (20 nm) is deposited thereon for protecting the resulting layer sequence from oxidation.

The sputtering parameters for the preparation of Cr, Pt, $Fe_xPt_{100-x}$ and $Co_yTb_{100-y}$ layers are listed as Table 1. The base pressure of the sputter chamber is controlled at approximately 5×10$^{-9}$ Torr, and the mentioned layers are deposited under an argon pressure P$_{Ar}$ ranged between 2 and 12 mTorr, so as to obtain a relatively improved magnetic property thereof. In more specifics, the argon pressure P$_{Ar}$ of 5 mTorr is preferred.

TABLE 1

| | |
|---|---|
| Deposition Temperature for Co$_{70}$Tb$_{30}$ | Ambient Temperature |
| Deposition Temperature for FePt (001) | 420° C. |
| RF Power Density | 2~7 W/cm$^2$ for Si$_3$N$_4$ Target |
| DC Power Density | 1~4 W/cm$^2$ for CoTb Target |
| DC Power Density | 0.2~0.5 W/cm$^2$ for FePt Target |
| Base Vacuum | 5 × 10$^{-9}$ Torr |
| Distance between Substrate and Target | 9 cm |
| Argon Pressure | 0.3~20 mTorr |
| Argon Flow Rate | 20 mL/min |

Figure 2:
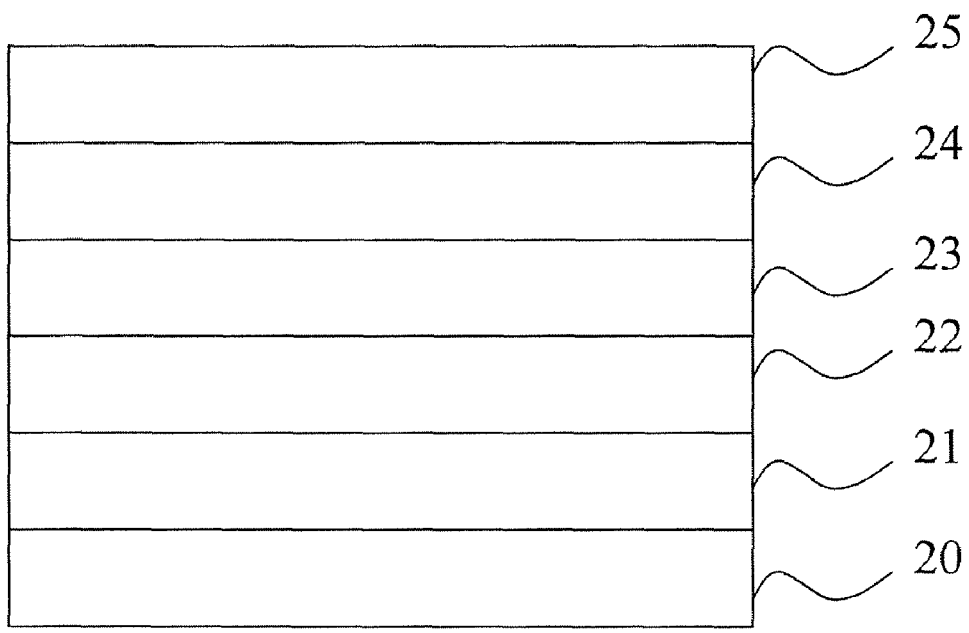
FIG. 2 is a cross-sectional view schematically illustrating the fabricated HAMR medium according to the preferred embodiment of the present invention.

Please refer to FIG. 2, which is a cross-sectional view schematically illustrating the fabricated HAMR medium according to the preferred embodiment of the present invention. The HAMR medium includes a substrate 20 which is a quartz substrate or a naturally oxidized silicon substrate, and thereon includes a layer sequence of an underlayer 21, a buffer layer 22, a magnetic layer 23, a recording and reading layer 24, and a passiviation layer 25. In a preferred embodiment, the underlayer 21 is made of Cr, the buffer layer 22 is made of Pt, the magnetic layer 23 and the recording and reading layer 24 are respectively made of Fe$_x$Pt$_{100-x}$ and Co$_y$Tb$_{100-y}$, and the passiviation layer 25 is a Si$_3$N$_4$ layer.

According to the present invention, the thickness of the Cr layer is ranged from 10 to 100 nm (preferably 70 nm), and the thickness of the Pt layer is ranged from 1 to 10 nm (preferably 2 nm). The thickness of the Fe$_x$Pt$_{100-x}$ layer is ranged from 5 to 60 nm, and the thickness of the Co$_y$Tb$_{100-y}$ layer is ranged from 20 nm to 60 nm. More preferably, the thickness of the Fe$_x$Pt$_{100-x}$ layer is 20 nm, and the thickness of the Co$_y$Tb$_{100-y}$ layer is 50 nm. Furthermore, the x value for the Fe$_x$Pt$_{100-y}$ layer is ranged from 45 to 55 and the y value for the Co$_y$Tb$_{100-y}$ layer is ranged from 65.8 to 71.9, and more preferably, x is 50 and y is 70.44.

In the present invention, the structure of the fabricated layer sequence is examined by an X-ray diffractometer (XRD) with Cu—Kα radiation and by Philips Tecnai F30 field emission gun transmission electron microscopy (TEM). The composition as well as the homogeneity of the CoTb magnetic layer is determined by means of energy disperse spectrum (EDS). The thickness of the fabricated layer sequence is measured by an atomic force microscope (AFM), and the magnetic properties thereof are measured by a vibrating sample magnetometer (VSM) with a maximum applied field of 12 kOe.

Figure 3:
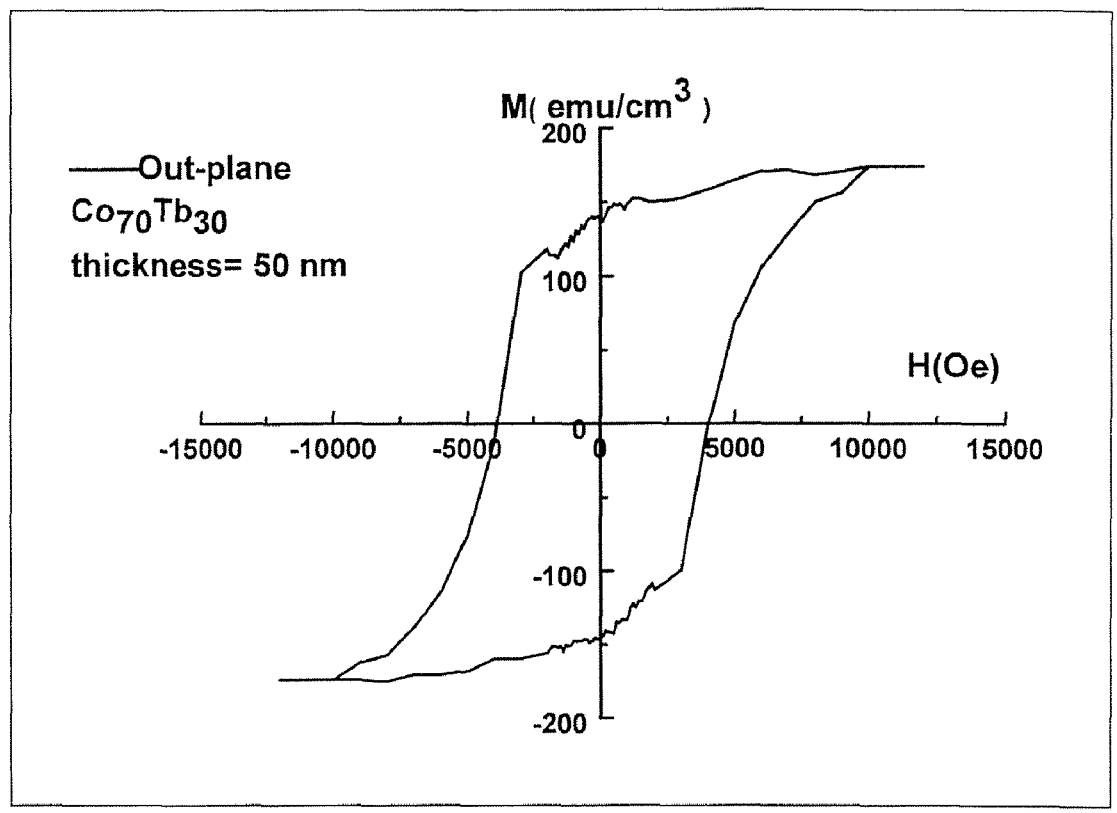
FIG. 3 is a diagram illustrating the M-H loop of a pre-deposited $Co_{70}Tb_{30}$ layer under the ambient temperature.

Please refer to FIG. 3, which is a diagram showing the M-H loop of the Co$_{70}$Tb$_{30}$ magnetic layer at the ambient temperature. It is shown that the coericivity (Hc⊥) and the saturation magnetization (Ms) of the Co$_{70}$Tb$_{30}$ magnetic layer are approximately 3600 Oe and 176 emu/cm$^3$, respectively, where the saturation magnetization is too small to be detected by a high resolution giant magneto-resistive (GMR) head or a tunneling magneto-resistive (TMR) head. Therefore, the FePt (001) layer is introduced under the Co$_{70}$Tb$_{30}$ layer in accordance with the preferred embodiment of the present invention, so as to increase the Ms value therefor.

Figure 4A:
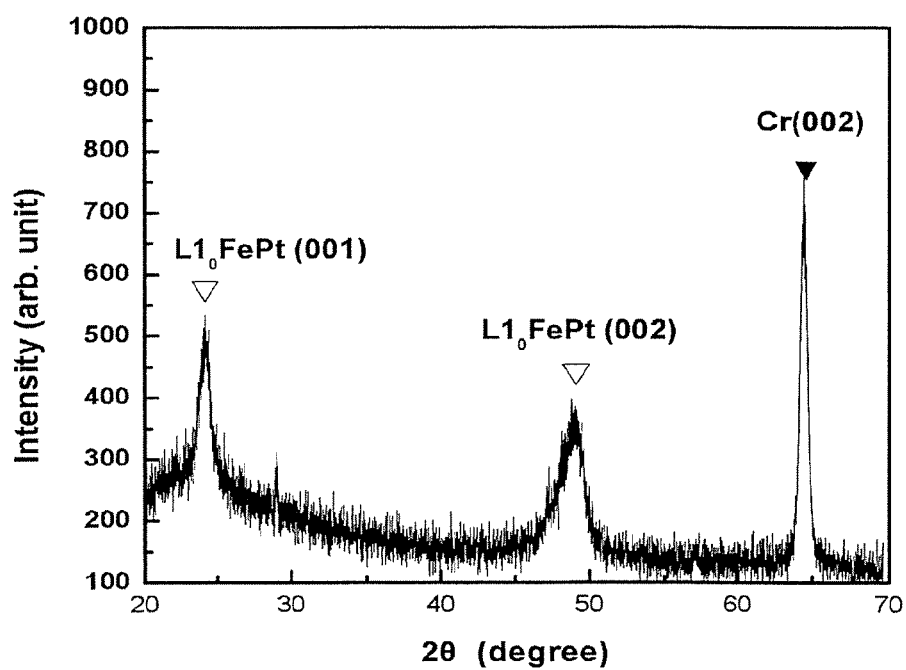
FIG. 4(A) and FIG. 4(B) are diagrams respectively illustrating the XRD pattern and the M-H loop of the pre-deposited FePt(001)/Pt(001)/Cr(002) layer sequence according to the present invention.
Figure 4B:
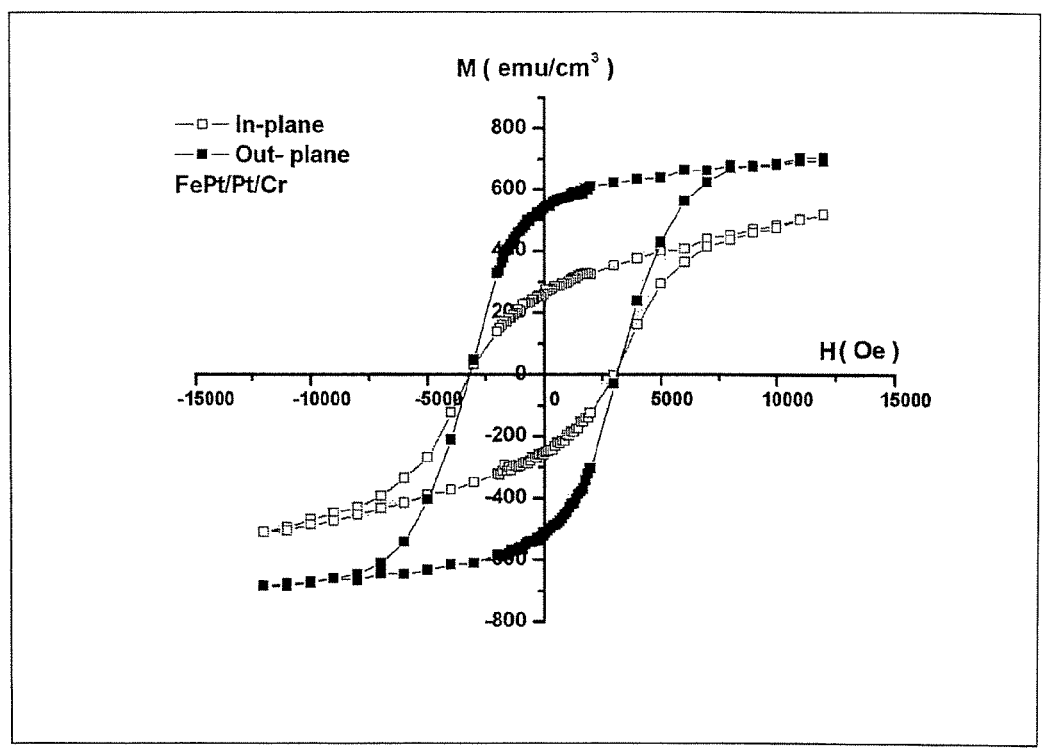

When the Pt(001)/Cr(200) layer sequence is introduced, the preferred orientation of the L1$_0$ FePt layer would switch from L1$_0$ FePt(111) to L1$_0$ FePt(001), and thus the FePt layer may exhibit a perpendicular magnetic anisotropy. In the absence of an Pt intermediate layer, however, the Cr atoms would diffuse directly into the FePt magnetic layer and thus suppress the formation of L1$_0$ FePt(001) preferred orientation. With reference to FIG. 4(A), which is an XRD pattern of FePt/Pt/Cr layer sequence, it is found that there exist the respective peaks of the Cr(002) reflection plane, (001) and (002) superlattice planes of the L1$_0$ FePt(001) phase. With reference to FIG. 4(B), which is a diagram showing the M-H loop of the pre-deposited FePt(001)/Pt(001)/Cr(002) layer sequence according to the present invention. It is apparent that the FePt(001)/Pt(001)/Cr(002) layer sequence exhibits a perpendicular magnetic anisotropy with an out-plane squareness (S$_⊥$) of about 0.8, and the Ms and Hc$_⊥$ values are about 691 emu/cm$^3$ and 3100 Oe, respectively.

Figure 5:
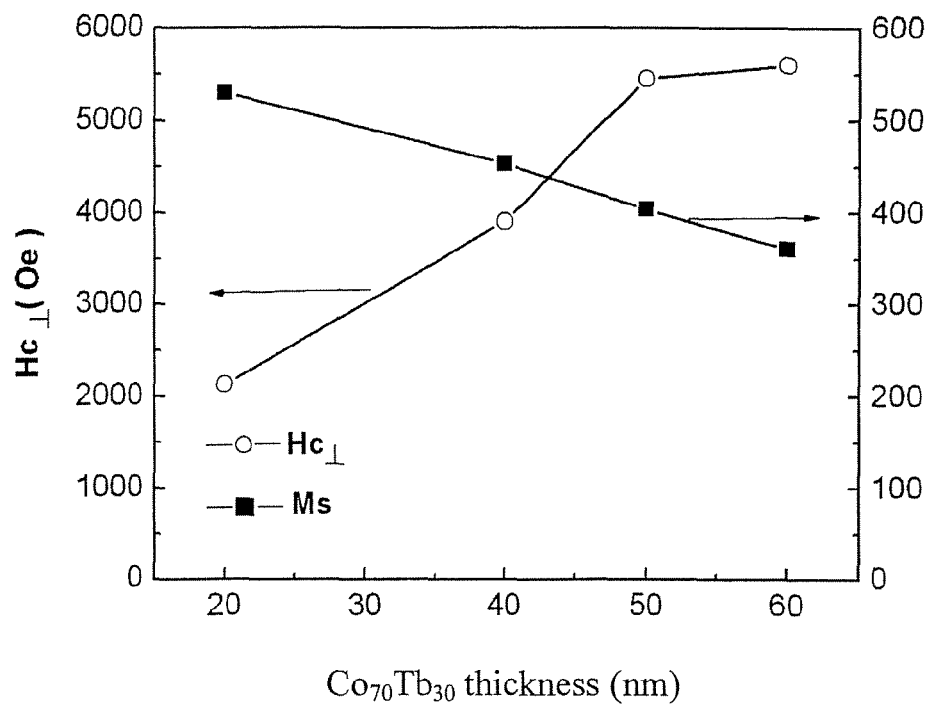
FIG. 5 is a diagram illustrating the Ms value variation and the Hc⊥ value variation of the HAMR medium depending on the thickness of the $Co_{70}Tb_{30}$ layer thereof in accordance with the present invention.

Please refer to FIG. 5, which is a diagram illustrating the Ms value variation and the Hc⊥ value variation of the HAMR medium depending on the thickness of the Co$_{70}$Tb$_{30}$ layer thereof in accordance with the present invention. As the Co$_{70}$Tb$_{30}$ film thickness increases from 20 to 60 nm, the Hc$_⊥$ value of the Co$_{70}$Tb$_{30}$/FePt(001)/Pt/Cr layer sequence may increase from about 2100 to 5700 Oe, and the Ms value thereof may decrease from 530 to 365 emu/cm$^3$. For the HAMR medium, a relatively large Hc$_⊥$ and Ms value at room temperature is always required, and hence the Co$_{70}$Tb$_{30}$ layer with a thickness of 50 nm is preferred in this case, which is deposited on the FePt(001) magnetic layer in the preferred embodiment.

Figure 6:
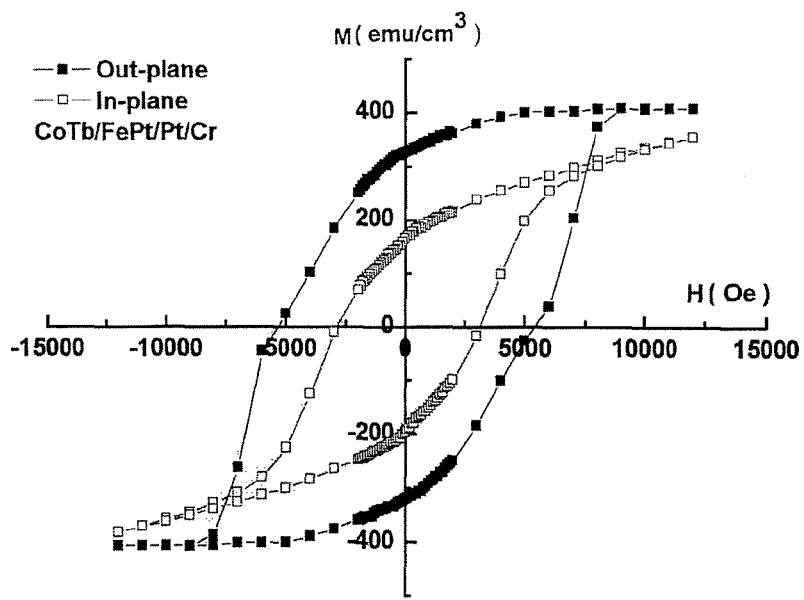
FIG. 6 is a diagram illustrating the M-H loop of the provided $Co_{70}Tb_{30}$/FePt(001)/Pt(001)/Cr(002) layer sequence of the HAMR medium according to the present invention.
Figure 7:
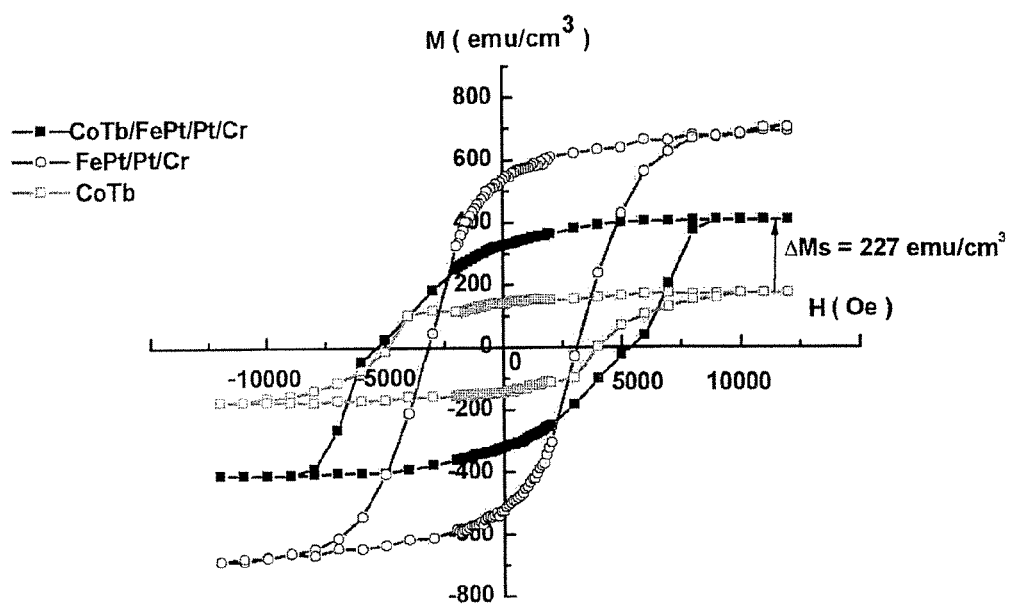
FIG. 7 is a diagram illustrating the comparison for M-H loop of the conventional $Co_{70}Tb_{30}$ recording layer, the provided FePt(001)/Pt(001)/Cr(002) layer sequence and the provided $Co_{70}Tb_{30}$/FePt(001)/Pt(001)/Cr(002) layer sequence of the HAMR medium according to the present invention.

Please refer to FIG. 6, which is a diagram showing the M-H loop of the fabricated Co$_{70}$Tb$_{30}$/FePt(001)/Pt/Cr layer sequence after the L1$_0$ FePt(001) preferred orientation layer is introduced into the Co$_{70}$Tb$_{30}$ layer whose thickness is 50 nm thereof. It shows that the Hc$_⊥$, Ms, S$_⊥$ and in-plane squarness (S$_{//}$) of the fabricated layer sequence are 5450 Oe, 403 emu/cm$^3$, 0.82 and 0.38, respectively. Moreover, with reference to FIG. 7 showing the respective M-H loops of a Co$_{70}$Tb$_{30}$ single layer, a FePt(001) layer and the fabricated Co$_{70}$Tb$_{30}$/FePt(001)/Pt/Cr layer sequence, it reveals that the Ms value of fabricated Co$_{70}$Tb$_{30}$/FePt(001)/Pt/Cr (Ms=403 emu/cm$^3$) is ranged between those of the Co$_{70}$Tb$_{30}$ single layer (Ms=176 emu/cm$^3$) and the FePt layer (Ms=691 emu/cm$^3$). Since the Co$_{70}$Tb$_{30}$ layer exhibit a ferrimagnetic property, and the FePt layer exhibits a ferromagnetic one, as well as the Ms value is defined as the moments in the domain of a material per unit volume, the Ms value of the fabricated Co$_{70}$Tb$_{30}$/FePt(001)/Pt/Cr layer sequence is thus ranged between those of the Co$_{70}$Tb$_{30}$ layer and the FePt(001)/Pt/Cr layer. On the other hand, the Hc$_⊥$ value of the Co$_{70}$Tb$_{30}$/FePt (001)/Pt/Cr layer sequence is larger than those of the Co$_{70}$Tb$_{30}$ layer and the FePt(001) layer. This is because there exists a large exchange coupling energy (about 2.75 erg/cm$^2$) at the interface between the Co$_{70}$Tb$_{30}$ and the FePt(001) layers. The exchange coupling of Co$_{70}$Tb$_{30}$/FePt(001) layer sequence is derived from the following equation:

$$\Delta\sigma = H_b \times M_s \times t, \quad (1)$$

where the H$_b$ is the biasing field, Ms is the saturation magnetization of Co$_{70}$Tb$_{30}$ layer and t is the thickness of FePt(001) layer. Therefore, owing to a relatively large Δσ, it becomes more difficult to reorient the moment of the Co$_{70}$Tb$_{30}$/FePt(001)/Pt/Cr layer sequence than that of the Co$_{70}$Tb$_{30}$ or FePt(001) single layer.

Figure 8:
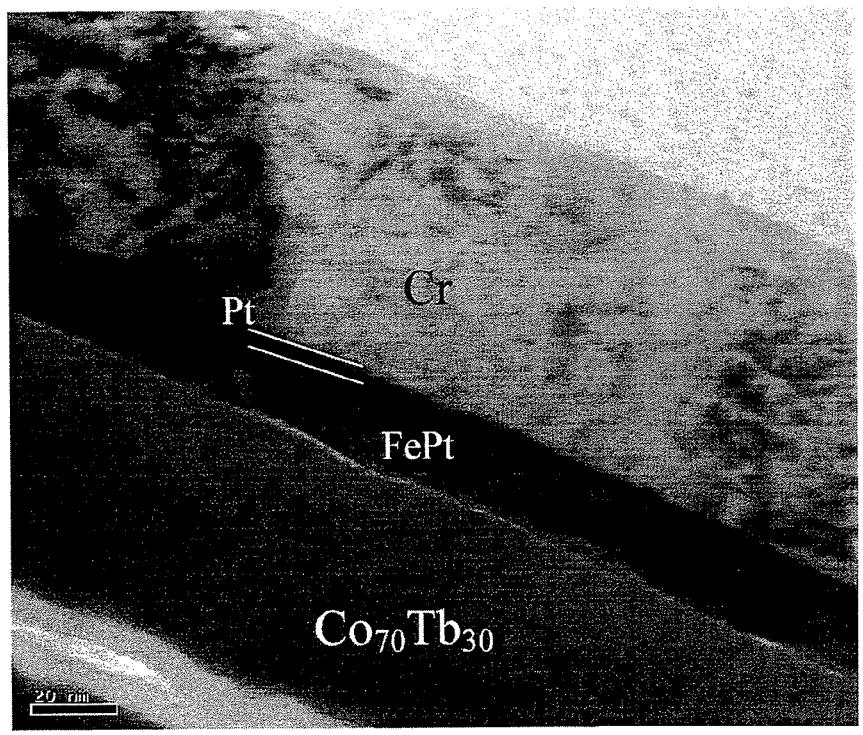
FIG. 8 is a TEM photo showing the cross-sectional view of the provided $Co_{70}Tb_{30}$/FePt(001)/Pt(001)/Cr(002) layer sequence of the HAMR medium according to the present invention.

With reference to FIG. 8 which is a TEM photo showing the cross-sectional view of the fabricated Co$_{70}$Tb$_{30}$/FePt(001)/Pt/Cr layer sequence, it reveals that the interface between the Co$_{70}$Tb$_{30}$ and FePt(001) layers is rough. Such roughness would create some areas of different domain orientations, and thus the uncompensated surfaces are increased. The more the uncompensated areas exist, the larger exchange interaction could be obtained.

Figure 9:
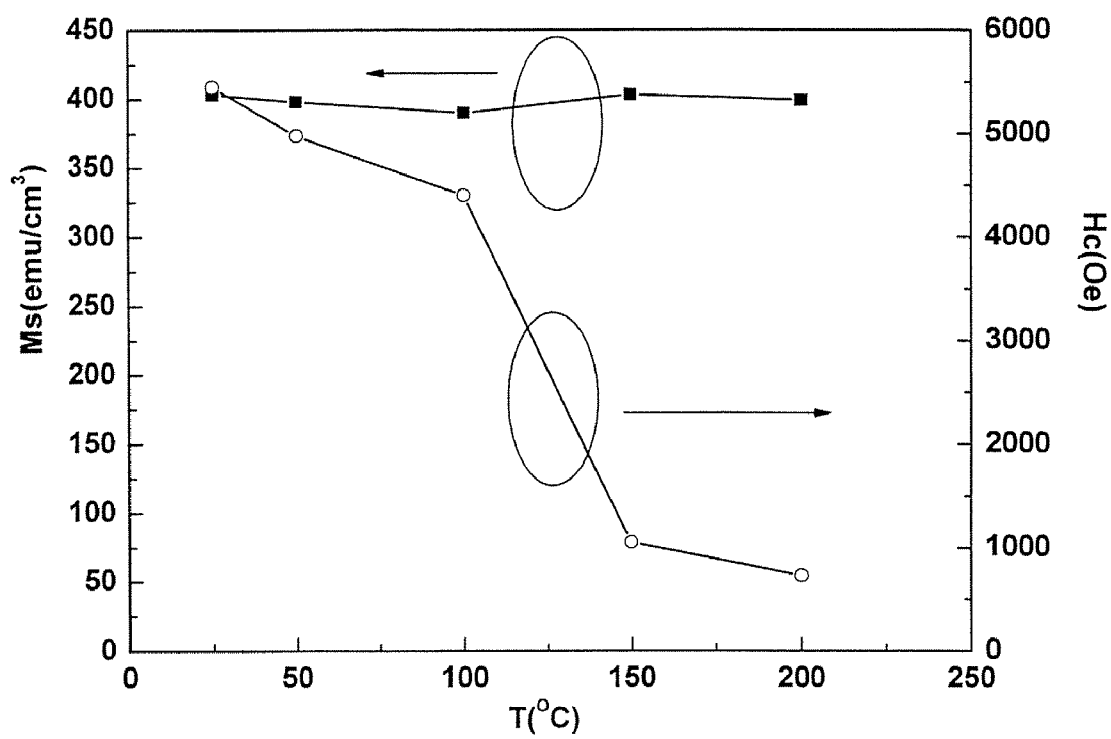
FIG. 9 is a diagram illustrating the Ms value variation and the Hc⊥ value variation of the $Co_{70}Tb_{30}$/FePt(001) layer sequence of the HAMR medium depending on the temperature in accordance with the present invention.

Please refer to FIG. 9, which is a diagram illustrating the Ms value variation and the Hc⊥ value variation of the $Co_{70}Tb_{30}/FePt(001)$ layer sequence of the HAMR medium depending on the temperature in accordance with the present invention. It shows that the Ms value of the fabricated $Co_{70}Tb_{30}/FePt(001)$ layer sequence almost keeps at a constant of about 400 emu/cm$^3$, even the temperature increases from the ambient temperature to 200° C., while the Hc$_\perp$ value thereof decreases from 5450 to 730 Oe. Such rapid decrement of Hc$_\perp$ value exactly satisfies the requirement for writing for the HAMR medium.

Through the present invention, a novel heat assisted magnetic recording (HAMR) medium and the fabrication method therefor are provided. The exchange coupling effect occurring at the interface of FePt/CoTb double layers is adopted, so that domains of the recording layer would be reproduced to the readout layer, and thus the resulting magnetic flux would be sufficient enough to be detected and readout under the room temperature. The provided HAMR medium exhibits a relatively high saturation magnetization and perpendicular coercivity, and thus possesses a great potential for the ultra-high density recording application.

Therefore, the present invention not only has the novelty and the progressiveness, but also has an industry utility.

While the invention has been described in terms of what is presently considered to be the most practical and preferred embodiment, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A heat assisted magnetic recording medium, comprising:
   a substrate;
   an underlayer located on said substrate;
   a buffer layer located on said underlayer;
   a magnetic layer being a $Fe_xPt_{100-x}$ layer, located on said buffer layer and having a perpendicular magnetic anisotropy, wherein x is ranged from 45 to 55; and
   a recording and reading layer being a $Co_yTb_{100-y}$ layer, located on said magnetic layer and having a perpendicular magnetic anisotropy, wherein y is ranged from 65.8 to 71.9.

2. The heat assisted magnetic recording medium according to claim 1, wherein said substrate is one of a glass substrate and an oxidized Si substrate.

3. The heat assisted magnetic recording medium according to claim 1, wherein said underlayer is a Cr layer.

4. The heat assisted magnetic recording medium according to claim 3, wherein said Cr layer has a thickness ranged from 10 to 100 nm.

5. The heat assisted magnetic recording medium according to claim 4, wherein said thickness of said Cr layer is 70 nm.

6. The heat assisted magnetic recording medium according to claim 1, wherein said buffer layer is a Pt layer.

7. The heat assisted magnetic recording medium according to claim 6, wherein said Pt layer has a thickness ranged from 1 to 10 nm.

8. The heat assisted magnetic recording medium according to claim 7, wherein said thickness of said Pt layer is 2 nm.

9. The heat assisted magnetic recording medium according to claim 1, wherein x is 50 and y is 70.44.

10. The heat assisted magnetic recording medium according to claim 1, wherein said $Fe_xPt_{100-x}$ layer has a thickness ranged from 5 to 60 nm, and said $Co_yTb_{100-y}$ layer has a thickness ranged from 20 nm to 60 nm.

11. The heat assisted magnetic recording medium according to claim 10, wherein said thickness of said $Fe_xPt_{100-x}$ layer is 20 nm, and said thickness of said $Co_yTb_{100-y}$ layer is 50 nm.

12. The heat assisted magnetic recording medium according to claim 1, further comprising a passiviation layer located on said recording and reading layer.

13. The heat assisted magnetic recording medium according to claim 12, wherein said passiviation layer is a layer of silicon nitride.

* * * * *